United States Patent
Monfray et al.

(10) Patent No.: US 11,698,296 B2
(45) Date of Patent: Jul. 11, 2023

(54) LIGHT SENSOR USING PIXEL OPTICAL DIFFRACTION GRATINGS HAVING DIFFERENT PITCHES

(71) Applicants: STMicroelectronics (Crolles 2) SAS, Crolles (FR); STMicroelectronics SA, Montrouge (FR)

(72) Inventors: Stephane Monfray, Eybens (FR); Olivier Le Neel, Saint Martin d Uriage (FR); Frederic Boeuf, Le Versoud (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 288 days.

(21) Appl. No.: 17/024,202

(22) Filed: Sep. 17, 2020

(65) Prior Publication Data

US 2021/0088378 A1    Mar. 25, 2021

(30) Foreign Application Priority Data

Sep. 25, 2019 (FR) ...................................... 1910593

(51) Int. Cl.
*G01J 1/04* (2006.01)
*H01L 31/0232* (2014.01)
*G01J 1/44* (2006.01)
*G02B 5/18* (2006.01)
*H01L 31/101* (2006.01)

(52) U.S. Cl.
CPC ............... *G01J 1/0411* (2013.01); *G01J 1/44* (2013.01); *G02B 5/1828* (2013.01); *G02B 5/1857* (2013.01); *H01L 31/02327* (2013.01); *H01L 31/1013* (2013.01); *G01J 2001/444* (2013.01)

(58) Field of Classification Search
CPC ............ G01J 2001/444; G02B 5/1828; G02B 5/1857; H01L 31/02327; H01L 31/1013
USPC ........................................ 257/431; 250/208.1
See application file for complete search history.

(56) References Cited

U.S. PATENT DOCUMENTS

| 7,714,368 B2 * | 5/2010 | Yang .................. G02B 27/1086 257/292 |
| 10,903,259 B2 * | 1/2021 | Rideau .............. H01L 27/14645 |
| 2009/0272880 A1 * | 11/2009 | Stanton ............. H01L 27/14621 257/E31.127 |

(Continued)

FOREIGN PATENT DOCUMENTS

WO    2018211971 A1    11/2018

OTHER PUBLICATIONS

INPI Search Report and Written Opinion for FR 1910593 dated May 15, 2020 (8 pages).

*Primary Examiner* — Que Tan Le
*Assistant Examiner* — Mai Thi Ngoc Tran
(74) *Attorney, Agent, or Firm* — Crowe & Dunlevy

(57) ABSTRACT

A light sensor includes a semiconductor substrate supporting a number of pixels. Each pixel includes a photoconversion zone extending in the substrate between a front face and a back face of the substrate. An optical diffraction grating is arranged over the back face of the substrate at a position facing the photoconversion zone of the pixel. For at least two different pixels of the light sensor, the optical diffraction gratings have different pitches. Additionally, the optical grating of each pixel is surrounded by an opaque wall configured to absorb at operating wavelengths of the sensor.

18 Claims, 9 Drawing Sheets

(56) References Cited

U.S. PATENT DOCUMENTS

| | | | |
|---|---|---|---|
| 2010/0127156 A1* | 5/2010 | Yokogawa | G02B 5/1809 |
| | | | 250/208.1 |
| 2011/0024781 A1* | 2/2011 | Fujimoto | H01L 33/38 |
| | | | 257/98 |
| 2011/0242350 A1* | 10/2011 | Sawayama | H01L 27/14625 |
| | | | 257/E31.127 |
| 2013/0113964 A1 | 5/2013 | Sasaki et al. | |
| 2015/0042858 A1 | 2/2015 | Kokubun et al. | |
| 2015/0168651 A1* | 6/2015 | Nishiwaki | H01L 31/054 |
| | | | 250/237 R |
| 2018/0315788 A1* | 11/2018 | Kuo | G02B 5/288 |

* cited by examiner

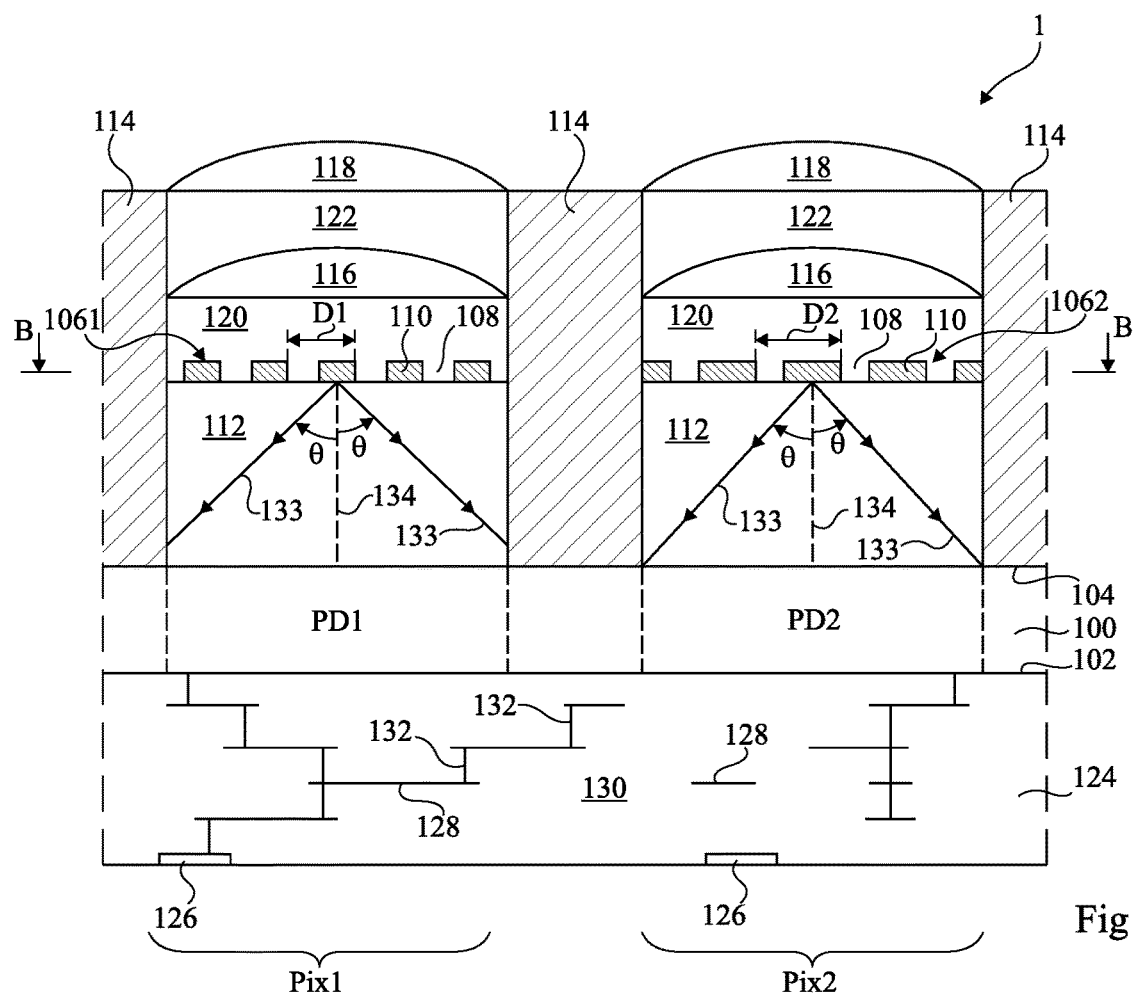
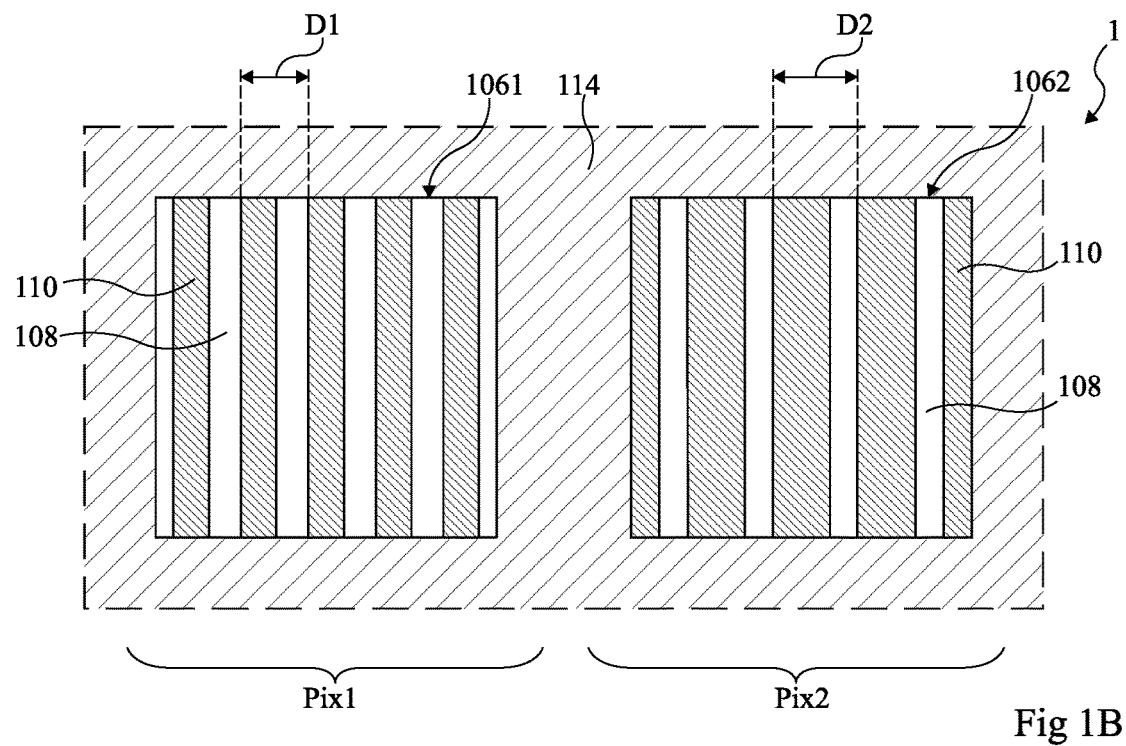

LIGHT SENSOR USING PIXEL OPTICAL DIFFRACTION GRATINGS HAVING DIFFERENT PITCHES

PRIORITY CLAIM

This application claims the priority benefit of French Application for Patent No. 1910593, filed on Sep. 25, 2019, the content of which is hereby incorporated by reference in its entirety to the maximum extent allowable by law.

TECHNICAL FIELD

The present disclosure relates generally to electronic circuits. The present invention more specifically relates to light sensors allowing for making a spectral analysis of the light that they receive.

BACKGROUND

Light sensors are known which allow for making a spectral analysis of the received light. These sensors, for example, allow for it to be determined, for a given quantity of received light to be analyzed, how this quantity of light is distributed among a plurality of wavelength ranges. Such sensors comprise a plurality of pixels each provided with a photo receiver, or photo conversion zone, and which are associated with a filter allowing the light to pass in a specific spectral band, or specific range of wavelengths, different for at least some of these pixels.

There is a need in the art for a light sensor that addresses all or some of the drawbacks of the known light sensors.

SUMMARY

One embodiment provides a light sensor which allows for the received light to be analyzed over a large number of wavelength ranges, for example at least ten wavelength ranges, each of the wavelength ranges being narrow, for example having a width of 50 nm or less.

Thus, one embodiment provides a light sensor comprising a semiconductor substrate and a plurality of pixels, wherein each pixel comprises: a photoconversion zone extending in the substrate, between a front face and a back face of the substrate; and a corresponding plurality of optical diffraction gratings, wherein each optical diffraction grating is positioned on the side of the back face of the substrate, at a location over and facing the photoconversion zone of a corresponding pixel, wherein the optical diffraction gratings of at least two of said pixels having different pitches.

According to one embodiment, the optical diffraction grating of each pixel is located at a same distance from the back face of the substrate.

According to one embodiment, each pixel comprises a wall absorbing at the operating wavelengths of the sensor, the wall surrounding the optical diffraction grating of the pixel and extending heightwise from the back face of the substrate, at least up to the level of the optical diffraction grating of the pixel.

According to one embodiment, each pixel comprises an optical device configured so that light reaches the optical diffraction grating of the pixel with a normal angle of incidence.

According to one embodiment, said optical device of each pixel comprises a first converging lens and a second converging lens, the first and second converging lenses being positioned one above the other, above and opposite the optical diffraction grating of said pixel.

According to one embodiment, at the back face of the substrate, part of the photoconversion zone configured to receive light has an identical surface for each pixel.

According to one embodiment, each pixel further comprises a device configured to prevent a zero order propagation of the light transmitted by the optical diffraction grating of the pixel to the photoconversion zone of the pixel.

According to one embodiment, the device configured to prevent the zero order propagation comprises: an electrically insulating material penetrating the substrate from the back face of the substrate to the photoconversion zone of the pixel and being located on a zero order path of the light transmitted by the optical diffraction grating of the pixel; and/or a material absorbing at the operating wavelengths of the sensor, resting on the back face of the substrate and being positioned on a zero order path of the light transmitted by the optical diffraction grating of the pixel.

According to one embodiment, the optical diffraction grating of each pixel comprises: a layer of a first material opaque at the operating wavelengths of the sensor or having, at the operating wavelengths of the sensor, an optical index at least one and a half times greater than the optical index of a second material covering the first material and being in contact with the first material; and a plurality of openings passing through the layer of the first material, the openings being distributed along the pitch of said optical diffraction grating and preferably being concentric and circular, or parallel to one another.

According to one embodiment, the sensor further comprises a processing circuit configured to receive, for each of said pixels, an output signal of the pixel representative of the quantity of light received by the pixel during an illumination phase of the sensor, the processing circuit further being configured to: determine, from output signals of at least one pair of pixels of the sensor whose diffraction gratings have different pitches, a portion of light to be analyzed received in a wavelength range determined by the pitches of the diffraction gratings of the pair of pixels; and/or determine a type of light received by the sensor during the illumination phase by comparing a set of values of said signals to sets of calibration values stored in a memory of the sensor.

Another embodiment provides a method for manufacturing a sensor as disclosed hereinabove, the method comprising the following successive steps: depositing a layer of a material transparent at the operating wavelengths of the sensor on the side of a back face of a semiconductor substrate provided with photoconversion zones extending in the substrate, between a front face and the back face of the substrate; depositing, on the layer of the transparent material, a layer of a first material opaque at said operating wavelengths or having, at said operating wavelengths, an optical index at least one and a half times greater than the optical index of a second material intended to cover the first material and to be in contact with the first material; and etching openings through the layer of opaque material so as to define an optical diffraction grating therein above and opposite each photoconversion zone, at least two optical diffraction gratings having different pitches.

According to one embodiment, the method comprises, after the step for defining optical diffraction gratings, the following successive steps: etching trenches through the layer of transparent material up to said back face, such that each optical diffraction grating is surrounded by a trench; and filling said trenches with a material absorbing at said working wavelengths.

Another embodiment provides a method for analysis of the light by a sensor as described above, the method comprising receiving, by the pixels of the sensor, light to be analyzed and generating, by each pixel of the sensor, an output value of the pixel representative of the quantity of light received by the pixel.

According to one embodiment, the method further comprises: a prior calibration step consisting of illuminating the sensor successively with lights of different types and storing, in the sensor, for each of the lights of different types, a map of the output values of the pixels; and a step consisting of determining the type of light to be analyzed by comparing the maps stored in the sensor during the calibration step to a map of the output values of the pixels generated when the sensor is illuminated with the light to be analyzed.

According to one embodiment, the method further comprises, for at least one pair of pixels of the sensor whose diffraction gratings have different pitches, a step of determining a proportion of light to be analyzed received in a determined wavelength range by the pitches of the diffraction gratings of the pair of pixels, from output values of the pixels of said at least one pair.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIGS. 1A and 1B show schematic and cross-sectional views, respectively transverse and top, of a light sensor according to one embodiment;

DETAILED DESCRIPTION

Figure 2:
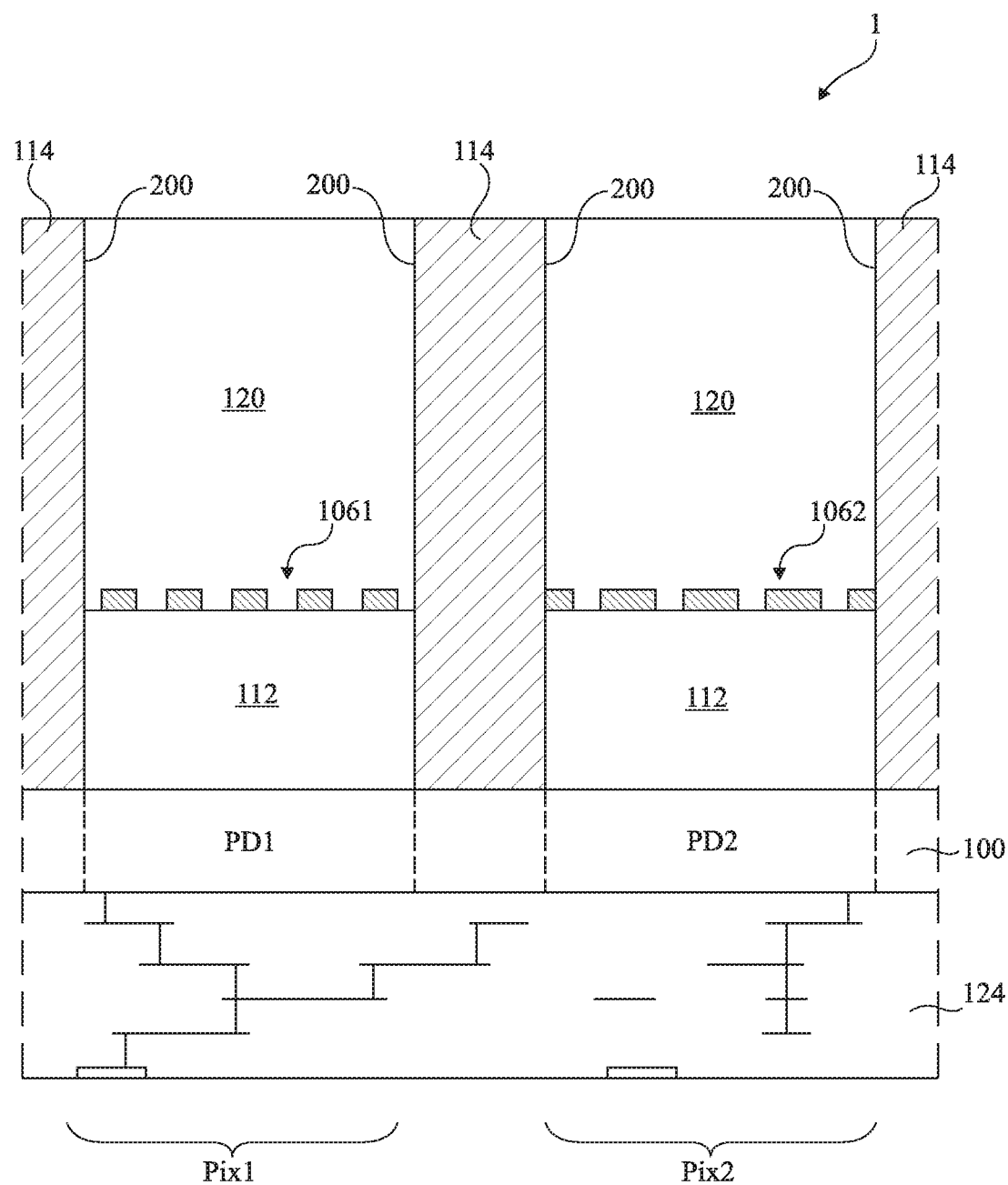
FIG. 2 shows a transverse view, schematic and in cross-section, of the light sensor of FIG. 1 according to one embodiment variant.

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the various electronic systems and applications in which a light sensor allowing a spectral analysis of the light can be provided have not been described in detail, the disclosed embodiments being compatible with these usual electronic systems and applications. Moreover, the reading circuits of a pixel of a sensor, configured to generate an output signal of the pixel having a value representative of the quantity of light received by a photoconversion zone of the pixel, have not been described in detail, the disclosed embodiments being compatible with the usual reading circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the remainder of the disclosure, operating wavelengths of a light sensor refer to the wavelengths comprised in a wavelength range where the sensor is able to provide a spectral analysis of the received light. Hereinafter, as an example, the case is considered of a sensor whose operating wavelengths are between 300 nm and 900 nm.

In the remainder of the description, a material is said to be transparent at a wavelength if, when a light ray of this wavelength strikes, under normal angle of incidence, a layer of this material with a thickness of one micrometer, less than 1% of the optical power of the ray is absorbed and/or reflected by the layer, or in other words, at least 99% of the optical power of the ray is transmitted through the layer.

In the remainder of the description, a material is said to be opaque at a wavelength if, when a light ray of this wavelength strikes, under normal angle of incidence, a layer of this material with a thickness of one micrometer, at least 99% of the optical power of the ray is absorbed and/or reflected by the layer, or in other words, less than 1% of the optical power of the ray is transmitted through the layer.

In the remainder of the description, a material is said to be absorbent at a wavelength preferably if, when a light ray of this wavelength strikes, under normal angle of incidence, a layer of this material with a thickness of one micrometer, at least 90% of the optical power of the ray is absorbed by the layer and less than 10% of the optical power of the ray is reflected by the layer and/or transmitted through the layer.

Here, the inventors propose a light sensor taking advantage of the fact that a ray of light passing through a diffraction grating is deflected even more when its wavelength is great or the pitch of the grating is small. More specifically, the inventors here propose a light sensor comprising pixels each provided with a photoconversion zone and a diffraction grating positioned above and facing this photoconversion zone, in which several pixels have different grating pitches. Furthermore, the pixels are configured such that, for a given incident light reaching the diffraction gratings of two pixels having different grating pitches, rays of the incident light having wavelengths greater than a given wavelength reach the photoconversion zone of one of these two pixels, and do not reach the photoconversion zone of the other of these two pixels. Thus, when the sensor receives light to be analyzed, by comparing the quantity of light received by one of these two pixels to that received by the other of these two pixels, the proportion of light to be analyzed comprised in a given wavelength range, fixed by the grating pitches of these two pixels, can be determined.

FIGS. 1A-1B show schematic cross-sectional views illustrating one embodiment of such a sensor 1. FIG. 1A is a transverse cross-sectional view of a portion of the sensor 1. FIG. 1B is a top cross-sectional view of this portion of the sensor 1, taken in the section plane BB of FIG. 1A.

The sensor 1 comprises pixels, for example several tens of pixels, or even several hundred pixels, although the portion of the sensor 1 illustrated in FIGS. 1A-1B only comprises two pixels Pix1 and Pix2.

The sensor 1 comprises a semiconductor substrate 100, for example made from silicon. Components and electronic circuits (not shown in FIGS. 1A-1B), for example reading circuits of the pixels of the sensor 1, are formed in and/or on the substrate 100, on the side of a front face 102 of the substrate 100 (lower face of the substrate 100 in FIG. 1A). The substrate 100 further comprises a back face 104 (upper face of the substrate 100 in FIG. 1A), opposite and parallel to the front face 102, the back face being configured to receive light.

Each pixel of the sensor 1 comprises a photoconversion zone. Each photoconversion zone extends in the substrate 100, between the front face 102 of the substrate 100 and the back face 104 of the substrate 100, for example from the front face 102 to the back face 104. The photoconversion zones of the pixels of the sensor are electrically insulated from one another by insulating walls not shown in FIGS. 1A-1B, these insulating walls preferably also being opaque at the operating wavelengths of the sensor. These insulating walls laterally delimit the photoconversion zones of the pixels. In FIG. 1A, only photoconversion zones PD1 and PD2 of the respective pixels Pix1 and Pix2 are visible and are laterally delimited by dotted lines.

Each pixel of the sensor 1 comprises, above and facing the photoconversion zone of the pixel, an optical diffraction grating. In particular, in FIGS. 1A-1B, the pixels Pix1 and Pix2 comprise respective diffraction gratings 1061 and 1062. These diffraction gratings are transmission diffraction gratings. In other words, these gratings are each made up of a plurality of openings 108 (or lines) passing through a layer 110 of an opaque material or a material having an optical index very different from that of the material covering the layer 110 and being in contact with the layer 110, for example at least one half times greater than the optical index of the material covering the layer 110 and being in contact with the layer 110. The material of the layer 110 is, for example, titanium nitride (TiN), titanium oxide (TiO$_2$), amorphous silicon or silicon nitride (SiN). The openings of the diffraction grating are regularly distributed with a given pitch, called pitch of the grating. In the example of FIGS. 1A-1B, the grating 1061 of the pixel Pix1 has a pitch D1 smaller than the pitch D2 of the grating 1062 of the pixel Pix2.

Although gratings 1061 and 1062 have been shown here comprising a smaller number of openings 108, each diffraction grating of the sensor 1 can, in practice, comprise a much larger number of openings 108. For example, in a measuring plane of the pitch of the grating, that is to say, a plane parallel to a repetition direction of the openings 108, each diffraction grating of the sensor 1 includes more than 100 openings per millimeter, or even more than 200 openings per millimeter.

The diffraction gratings of the pixels of the sensor 1 are all positioned at a same distance from the back face 104 of the substrate 100.

In the embodiment illustrated by FIG. 1B, in each diffraction grating of the sensor 1, the openings 108 are rectilinear and parallel to one another. More specifically, these openings 108 are, in top view, that is to say, in a plane parallel to the back face 104 of the substrate 100 passing through the considered diffraction grating, in the form of parallel rectilinear strips, that is to say, strips extending longitudinally from a first end of the diffraction grating to a second edge of the diffraction grating opposite the first edge. The diffraction gratings are then preferably rectangular or square, preferably with two opposite sides parallel to the longitudinal direction of the openings 108.

According to one embodiment, as illustrated by FIGS. 1A-1B for the gratings 1061 and 1062 of the respective pixels Pix1 and Pix2, in each pixel, the diffraction grating of the pixel rests on a layer 112 of a material transparent at the operating wavelengths of the sensor 1, preferably in contact with this layer 112, the layer 112 resting on the back face 104 of the substrate 100, preferably in contact with the face 104. As an example, the layer 112 is made from silicon oxide. Preferably, the thickness of the layer 112 is identical in all of the pixels of the sensor, such that all of the diffraction gratings of the pixels of the sensor 1 are at a same distance from the back face 104 of the substrate 100.

According to one embodiment, each pixel of the sensor 1 comprises a wall 114 absorbing at the operating wavelengths of the sensor 1, or in other words, a wall 114 made from a material absorbing at the operating wavelengths of the sensor 1. As an example, the wall 114 is made from black resin or polycrystalline silicon, preferably black resin. As an example, the thickness of the wall 114, for example measured in a plane parallel to the back face 104 of the substrate 100, is greater than 500 nm.

In each pixel of the sensor 1, the wall 114 completely surrounds the diffraction grating of the pixel, as shown more specifically in FIG. 1B, where the wall 114 completely surrounds the gratings 1061 and 1062 of the respective pixels Pix1 and Pix2. Furthermore, the wall 114 extends heightwise from the back face 104 of the substrate 100, at least up to the level of the diffraction gratings, that is to say, at least up to the upper face of the layer 112 in this example. The presence of such a wall 114 allows a ray of light deflected by the diffraction grating of a pixel and reaching the wall 114 not to be reflected toward the photoconversion zone of the pixel or transmitted to the photoconversion zone of a neighboring pixel.

From the side of the back face 104 of the substrate 100, and preferably at this back face, the photoconversion zone of each pixel comprises a part configured to receive light, and optionally, a covered peripheral part of the wall 114 that will therefore not receive light. Preferably, in each pixel of the sensor 1, the part of the photoconversion zone receiving light has the same shape as the diffraction grating positioned above the photoconversion zone.

According to one embodiment, in all of the pixels of the sensor 1, the part of the photoconversion zone of the pixel that is configured to receive light has an identical surface (shape and dimensions).

According to one embodiment, each pixel further comprises an optical device configured so that the light reaching the diffraction grating of this pixel has a normal angle of incidence relative to the diffraction grating, or in other words, propagates up to the diffraction grating along a direction orthogonal to the diffraction grating, that is to say, here orthogonal to the upper surface of the layer 110 of the diffraction grating.

In the embodiment illustrated by FIGS. 1A-1B, this optical device comprises, for each pixel, two converging lenses 116 and 118 positioned above and facing the diffraction grating of the pixel, the lens 118 being positioned above the lens 116. The focal distances of the lenses 116 and 118 and the distance separating these two lenses are such that array of light reaching the upper lens 118 and propagating to the lower lens 116, next propagates to the diffraction grating of the pixel along a direction orthogonal to this diffraction grating.

In the embodiment illustrated by FIGS. 1A-1B, a layer 120 of a material transparent at the operating wavelengths of the sensor, for example a layer 120 of silicon oxide, covers the diffraction grating of each pixel of the sensor 1, and the lower lens 116 of the pixel rests on the layer 120, preferably in contact with the layer 120. Furthermore, a layer 122 of a material transparent at the operating wavelengths of the sensor, for example a layer 122 of silicon oxide, covers the lower lens 116 of each pixel of the sensor 1, and the upper lens 118 of the pixel rests on the layer 122, preferably in contact with the layer 122.

In the specific example of FIGS. 1A-1B, for each pixel of the sensor 1, the wall 114 extends heightwise through the layers 120 and 122, the wall 114 then surrounding the lenses 116 and 118 of the pixel. In other words, the wall 114 is positioned, or extends, over the entire periphery of the lenses 116 and 118. However, in other examples that are not illustrated, the wall 114 may not extend through the layer 122, or may not extend through the layer 120.

In an embodiment variant that is not illustrated, the lenses 118 and 116 are replaced by a pair of converging lenses outside the sensor 1, for example two external lenses positioned in an opening of a housing in which the sensor 1 is enclosed, or encased. In this variant, the layer 120 can be omitted and/or, in each pixel, the wall 114 may not extend above the diffraction grating of the pixel.

The sensor 1 comprises an interconnection structure 124 resting on the front face 102 of the substrate 100. The interconnection structure 124 comprises, for example, on the side of a face opposite the front face 102 of the substrate 100, electrical connection elements 126, for example electrically conductive studs, configured to electrically connect the sensor 1 to other elements, devices or electronic circuits. The interconnection structure 124 is configured to electrically connect electronic components and/or circuits formed at the front face 102 of the substrate, for example reading circuits of the pixels of the sensor, to one another and/or to the pads 126. As an example, the interconnection structure is made up of portions of electrically conductive layers 128 insulated from one another by insulating layers (here shown in the form of a single layer 130), and electrically conductive vias 132 coupling portions of layers 128 to one another, to the components and electronic circuits of the sensor 1 and/or to the pads 126.

Although this is not shown in FIGS. 1A-1B, the sensor 1 comprises a processing circuit configured to receive, for each pixel, an output signal supplied by a reading circuit of the pixel, this output signal being representative of the total quantity of light received by the photoconversion zone of the pixel during an illumination or integration phase.

During operation, the sensor 1 receives light to be analyzed. When the light to be analyzed reaches a diffraction grating of a pixel of the sensor, for each wavelength $\lambda$ of the light to be analyzed, a ray of light 133 is deflected by an angle $\theta$. In the embodiment of FIGS. 1A-1B, the angle $\theta$ is determined relative to a plane 134 of symmetry of the diffraction grating that is orthogonal to the measuring direction of the pitch of the diffraction grating. More specifically, the ray is deflected by an angle $\theta$ according to the following relationship: $D*\sin(\theta)=\lambda$ where D is the pitch of the network.

Thus, a ray of light from the light to be analyzed having a given wavelength $\lambda$ reaches the photoconversion zone of certain pixels of the sensor, but does not reach the photoconversion zones of other pixels of the sensor having a smaller grating pitch. In the example of FIGS. 1A-1B, the illustrated ray 133 reaches the zone PD2 of the pixel Pix2, but not the zone PD1 of the pixel Pix1.

As an example, first, second, third and fourth pixels are considered having first, second, third and fourth grating pitches that are progressively smaller. When the light to be analyzed reaches the sensor 1, therefore the diffraction gratings of the first, second, third and fourth pixels:

the photoconversion zone of the first pixel receives a first quantity of light representative of the proportion of light to be analyzed transported by the wavelengths smaller than a first wavelength $\lambda 1$;

the photoconversion zone of the second pixel receives a second quantity of light representative of the proportion of light to be analyzed transported by the wavelengths smaller than a second wavelength $\lambda 2$ that is smaller than the first wavelength $\lambda 1$;

the photoconversion zone of the third pixel receives a third quantity of light representative of the proportion of light to be analyzed transported by the wavelengths smaller than a third wavelength $\lambda 3$ that is smaller than the second wavelength $\lambda 2$; and the photoconversion zone of the fourth pixel receives a fourth quantity of light representative of the proportion of light to be analyzed transported by the wavelengths smaller than a fourth wavelength $\lambda 4$ that is smaller than the third wavelength $\lambda 3$.

In other words, the value of the output signal, or output value, respectively of the first pixel, the second pixel, the third pixel and the fourth pixel is representative of a proportion of light to be analyzed in the wavelength range respectively below the first wavelength $\lambda 1$, the second wavelength $\lambda 2$, the third wavelength $\lambda 3$ and the fourth wavelength $\lambda 4$.

According to one light analysis embodiment, the sensor 1, for example using its processing circuit, is configured to determine, from output signals of a pair of pixels having different pitches, a portion of light to be analyzed received by the sensor in a wavelength range determined by the pitches of the diffraction gratings of the pixels of the pixel pair.

Returning to the example of the first, second, third and fourth pixels above, the sensor 1, for example using its processing circuit, is configured to determine the proportion of light to be analyzed comprised between the first wavelength $\lambda 1$ and the second wavelength $\lambda 2$, from output values of the first and second pixels. This is, for example, implemented by subtracting the output value of the second pixel from that of the first pixel, optionally after having normalized these values, for example relative to the output value of a reference pixel of the sensor 1 similar to the other pixels of the sensor but devoid of diffraction grating, preferably a reference pixel having the same dimensions as the other pixels of the sensor 1 but devoid of diffraction grating. Similarly, the sensor 1, for example using its processing circuit, is configured to determine the proportion of light to be analyzed comprised between the second wavelength $\lambda 2$ and the third wavelength $\lambda 3$ from output values of the second and third pixels, and to determine the proportion of light to be analyzed comprised between the third wavelength $\lambda 3$ and the fourth wavelength $\lambda 4$ from output values of the third and fourth pixels.

Preferably, the sensor 1, for example using its processing circuit, is configured to apply, to the output value of each pixel, a corrective factor representative of the ratio between the total surface of the openings 108 of the diffraction grating of the pixel and the total surface of the diffraction grating of this pixel. This processing enables to account for the fact that the total quantity of light transmitted by a diffraction grating depends on the total surface of its openings, therefore that two diffraction gratings with a same surface but different pitches do not transmit the exact same quantity of light for a same quantity of incident light. Alternatively, one skilled in the art is able to modify the dimensions of the openings of two diffraction gratings with a same surface but different pitches such that, for a same quantity of incident light, each of the two gratings transmits the same quantity of light.

According to another light analysis embodiment able to be used independently of or in combination with the embodiment described above, a calibration step of the sensor 1 is provided.

During this calibration step, the sensor 1 is successively illuminated with different types of light, that is to say, with lights having different spectrums, for example blue light, natural light, light emitted by a screen, incandescent light, fluorescent light, halogen light, light coming from a defined light source and having passed through a known sample, light coming from a defined light source and having been reflected by a known sample, etc. For each type of light, the sensor 1, for example using its processing circuit, is configured to store, in the sensor 1, for example in a memory of the sensor 1, all of the values of the output signals of the pixels, optionally after a step for normalization of these values similar to that previously described. Each set of stored values constitutes a map of the output values of the pixels, or in other words, a set of calibration values, representative of the type of received light.

During a later step where the sensor 1 receives the light to be analyzed, the set of output values of the pixels obtained for this light to be analyzed, optionally normalized as previously described, constitutes a map of the output values of the pixels representative of the type of received light. This map is then compared by the sensor 1, for example by using its processing circuit, to the maps stored in the sensor 1 during the calibration step so as to determine the type of received light to be analyzed, or even, in the case where this light is transmitted through a sample to be analyzed or reflected by a sample to be analyzed, the composition of the sample. As an example, the sensor 1, for example by using its processing circuit, is configured to calculate a piece of information representative of the difference between the map of the output values of the pixels obtained for the light to be analyzed and each of the maps of the output values of the pixels stored during the calibration phase, the type of light received then being identified as that corresponding to the map obtained during the calibration phase for which this difference is the smallest, or at least considered to be very close to the type of light corresponding to the map obtained during the calibration phase for which this difference is the smallest.

Although examples have been described above of a sensor 1 comprising a reduced number of different grating pitches, in practice, the sensor 1 can comprise several tens, or even several hundreds of different grating pitches, which allows the light to be analyzed over several tens, or even several hundreds of wavelength ranges. The inventors have noted that these wavelength ranges can be narrow, for example each have a width, or span, of less than or equal to 50 nm.

One may have thought to make a light sensor allowing the light to be analyzed over several tens, or even several hundreds of narrow wavelength ranges by using multilayer interferential filters rather than diffraction gratings with different pitches. However, the manufacture of such a sensor would be very difficult and much more complex than that of a sensor 1 as disclosed hereinabove.

One may also have thought to make a light sensor allowing the light to be analyzed over several tens, or even several hundreds of wavelength ranges by using plasmonic filters that are easy to manufacture rather than diffraction gratings with different pitches. However, plasmonic filters have a low spectral selectivity and such a sensor would not have made it possible to analyze the light over a large number of narrow wavelength ranges, unlike what is allowed by a sensor 1 as described herein above.

FIG. 2 shows a schematic and cross-sectional transverse view of the sensor 1 of FIGS. 1A-1B according to another embodiment variant. Each pixel of the sensor 1 of FIG. 2 differs from a corresponding pixel of the sensor 1 of FIGS. 1A-1B only by using its optical device configured so that the light reaches the diffraction grating of the pixel under normal angle of incidence. Only the differences between these devices will be highlighted here.

More specifically, each pixel of the sensor 1 of FIG. 2 differs from a corresponding pixel of the sensor 1 of FIGS. 1A-1B in that: —the lenses 116 and 118 are omitted; and —the wall 114 protrudes above the level of the diffraction grating of the pixel up to a sufficient height for the light to be analyzed passing in an opening 200 defined by the wall 114, above and opposite the diffraction grating of the pixel, to reach the diffraction grating of the pixel under normal angle of incidence.

One skilled in the art is able to determine the height over which the wall 114 rises from the level of the diffraction gratings in order to obtain this normal angle of incidence, this height depending in particular on the surface of the diffraction gratings.

In the example shown in FIG. 2, the layer 122 is omitted and the layer 120 fills the opening 200 above the diffraction grating of each pixel. The presence of the layer 120 imparts better mechanical strength to the sensor 1, although it can be omitted.

The sensor 1 of FIG. 2 benefits from the same advantages as the sensor 1 of FIGS. 1A-1B. Furthermore, the light analysis embodiments disclosed in relation with the sensor 1 of FIGS. 1A-1B apply to the sensor 1 of FIG. 2.

Figure 3A:
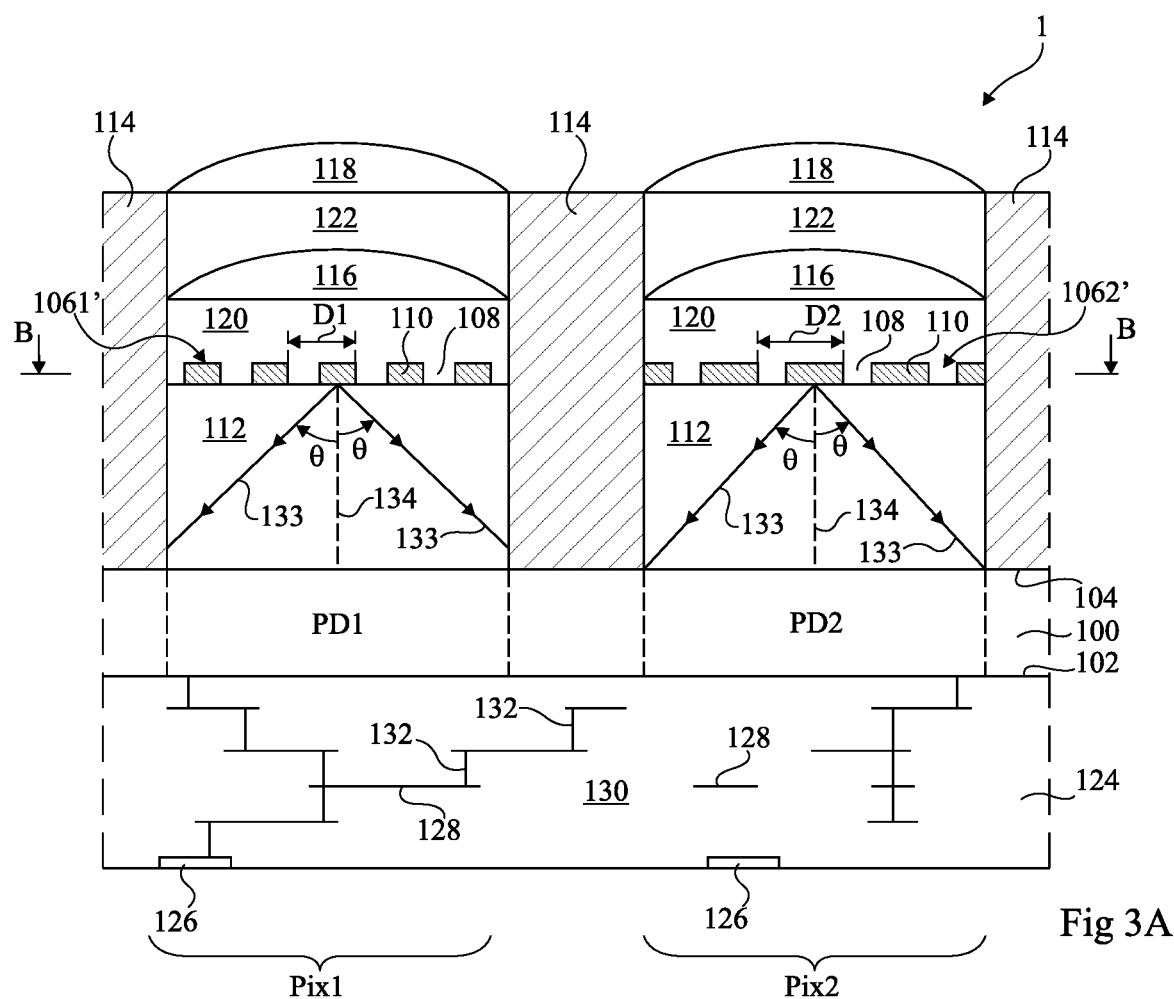
FIGS. 3A-3B show schematic and cross-sectional views, respectively transverse and top, of the light sensor of FIG. 1 according to another embodiment variant.
Figure 3B:
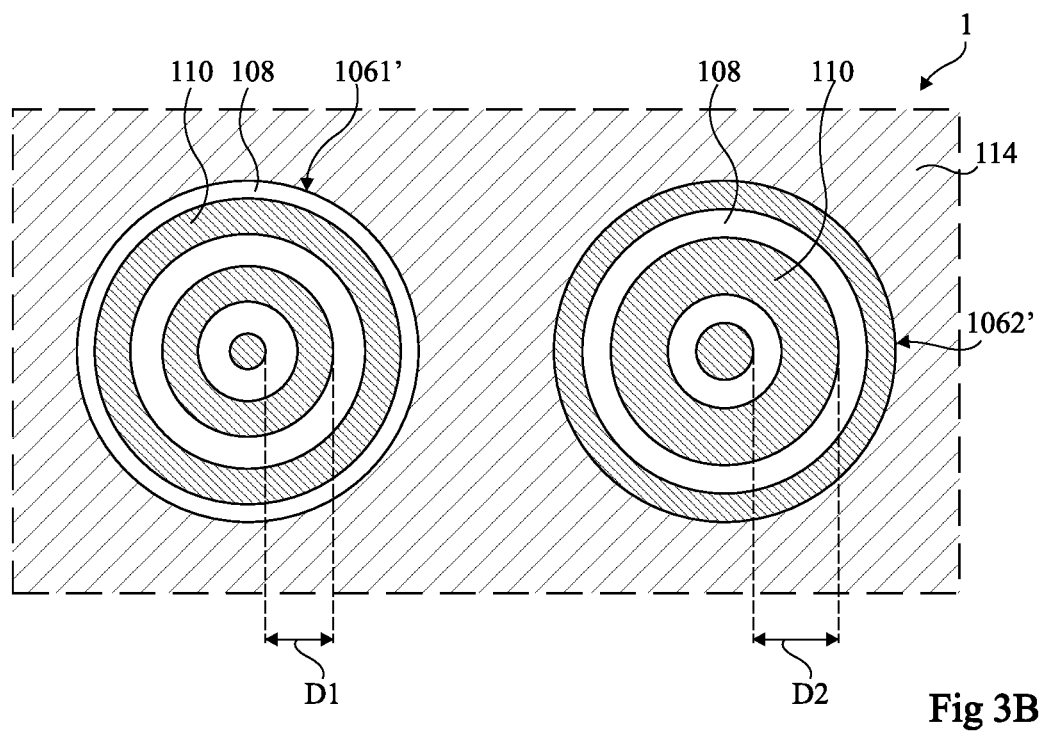

FIGS. 3A-3B show schematic and cross-sectional views, respectively transverse and top, of the light sensor of FIGS. 1A-1B according to another embodiment variant. More specifically, FIGS. 3A-3B illustrate an embodiment variant of the diffraction gratings of the pixels of the sensor 1, FIGS. 3A-3 corresponding to the respective FIGS. 1A-1B. Only the differences between the embodiment disclosed in relation with FIGS. 1A-1B and the embodiment variant disclosed in relation with FIGS. 3A-3B are highlighted here. In particular, in FIGS. 3A-3B, the pixels Pix1 and Pix2 comprise respective diffraction gratings 1061' and 1062' in place of the gratings 1061 and 1062 disclosed in relation with FIGS. 1A-1B.

In this embodiment variant, in each diffraction grating, for example in each grating 1061', 1062' shown in FIGS. 3A-3B, the openings 108 are circular and concentric. More specifically, these openings 108 are, in top view, that is to say, in a plane parallel to the back face 104 of the substrate 100 passing through the considered diffraction grating, in the form of concentric circular strips. The diffraction gratings are then preferably circular, for example concentric with the openings 108 as illustrated for the gratings 1061' and 1062'. Preferably, in each pixel, the part of the photoconversion zone configured to receive light then has the same shape as the diffraction grating of the pixel, that is to say, a circular shape seen from above.

In this variant, when the light to be analyzed reaches a diffraction grating of a pixel of the sensor, for example the grating 1061' of the pixel Pix1 or the grating 1062' of the pixel Pix2, for each wavelength λ of the light to be analyzed, a light ray 133 is deflected by an angle θ relative to the axis of symmetry of the diffraction grating of the pixel, according to the mathematical relationship previously indicated.

Similarly to what was previously indicated for the diffraction gratings disclosed in relation with FIGS. 1A-1B, although diffraction gratings have been shown here comprising a smaller number of openings 108, each diffraction grating can, in practice, comprise a much larger number of openings 108. For example, each diffraction grating comprises, in a measuring plane of the pitch of the grating, that is to say, comprising the axis of symmetry of the diffraction grating, more than 100 openings per millimeter, or even more than 200 openings per millimeter.

This embodiment variant of the diffraction gratings of the pixels is compatible with the embodiment variant disclosed in relation with FIG. 2.

Furthermore, the operation of a sensor 1 comprising diffraction gratings as disclosed in relation with FIGS. 3A-3B is identical to that of a sensor 1 comprising diffraction gratings as disclosed in relation with FIGS. 1A-1B and will not be described in detail again.

Figure 4:
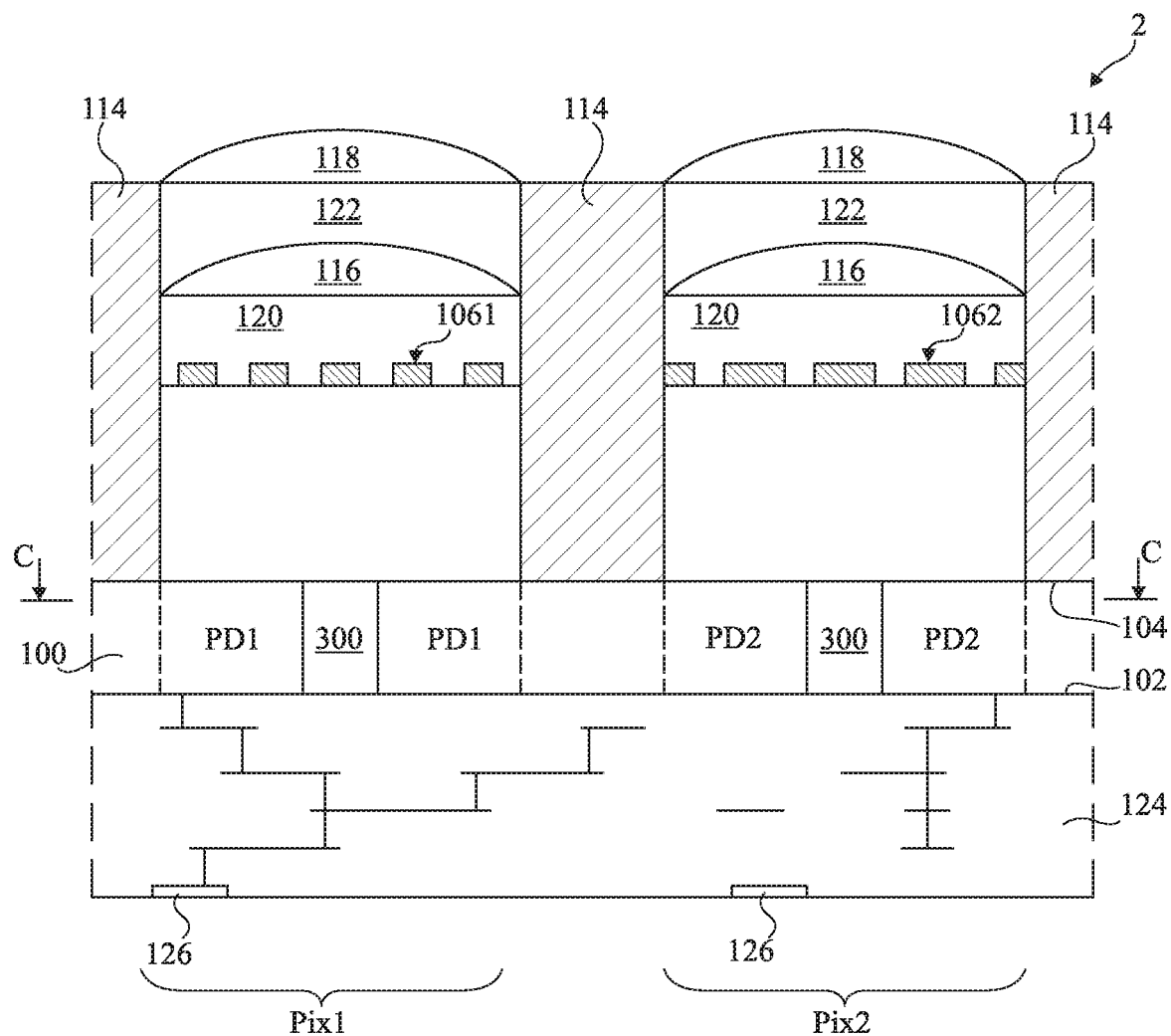
FIG. 4 shows a transverse view, schematic and in cross-section, of a light sensor according to another embodiment.

FIG. 4 shows a schematic and cross-sectional transverse view of a light sensor 2 according to another embodiment. The cross-sectional view of the sensor 2 of FIG. 4 corresponds to the cross-sectional view of the sensor 1 of FIG. 1A. In particular, only two pixels Pix1 and Pix2 of the sensor 2 are shown in FIG. 4. The sensors 1 and 2 comprise many common elements, and only the differences between these sensors are highlighted here.

The sensor 2 differs from the sensor 1 in that it further comprises a device configured to prevent the zero order propagation of the light transmitted by a diffraction grating of a pixel to the photoconversion zone of the pixel.

Indeed, in the embodiments, the modes of implementation and the variants disclosed here, the non-nil orders are used, in particular order one, of the light transmitted by the diffraction gratings of the pixels of the sensor in order to analyze light. Thus, the contribution of the zero order to the output value of a pixel can be considered noise.

The provision, in each pixel of the sensor, of a device that allows the zero order of the transmitted light to be prevented from reaching the photoconversion zone of the pixel, and therefore contributing to its output value, allows the signal-to-noise ratio of the pixel to be improved.

The sensor 2 therefore makes it possible to determine, with a greater precision than the sensor 1, the proportion of light to be analyzed in each of the wavelength ranges of a plurality of analysis wavelength ranges, and/or a received type of light relative to types of light used during a calibration phase.

In the example illustrated by FIG. 4, in each pixel, the device for suppressing the zero order of the light transmitted by the diffraction grating of the pixel, or diffracted light, comprises an electrically insulating material 300, for example silicon oxide. The material 300 is arranged on the path of the zero order of the diffracted light and penetrates the substrate 100 from the back face 104 into the photoconversion zone of the pixel, for example in the zone PD1, respectively PD2, of the pixel Pix1, respectively Pix2. Preferably, in each pixel, the material 300 passes through the photoconversion zone of the pixel. Preferably, in each pixel, the material 300 extends up to the front face 102 of the substrate 100. Thus, in each pixel, when the zero order of the diffracted light is propagated toward the photoconversion zone of the pixel, this zero order reaches the material 300 but does not reach the photoconversion zone of the pixel.

Figure 5:
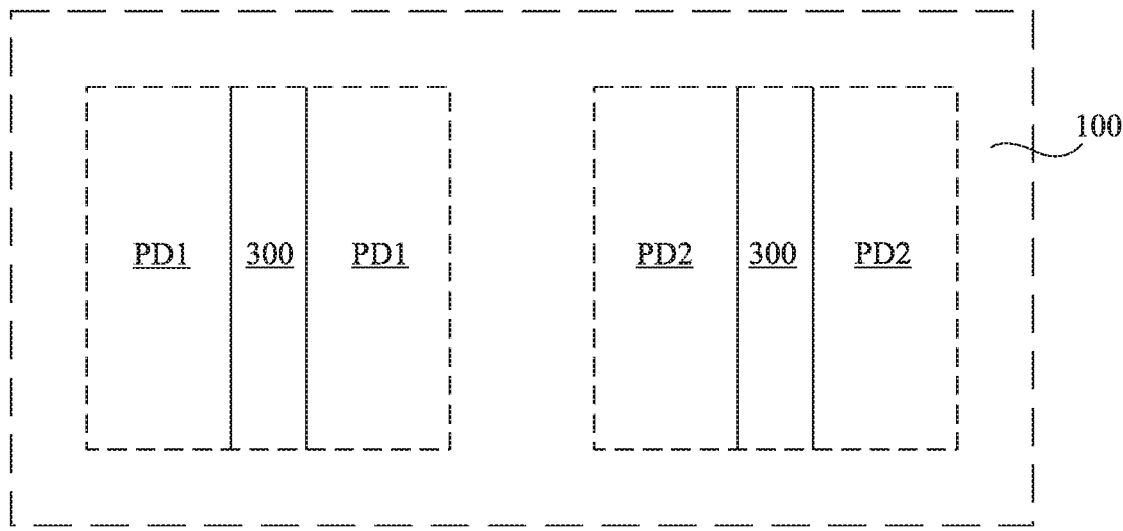
FIG. 5 shows a top view, schematic and in cross-section, of the sensor of FIG. 4.
Figure 6:
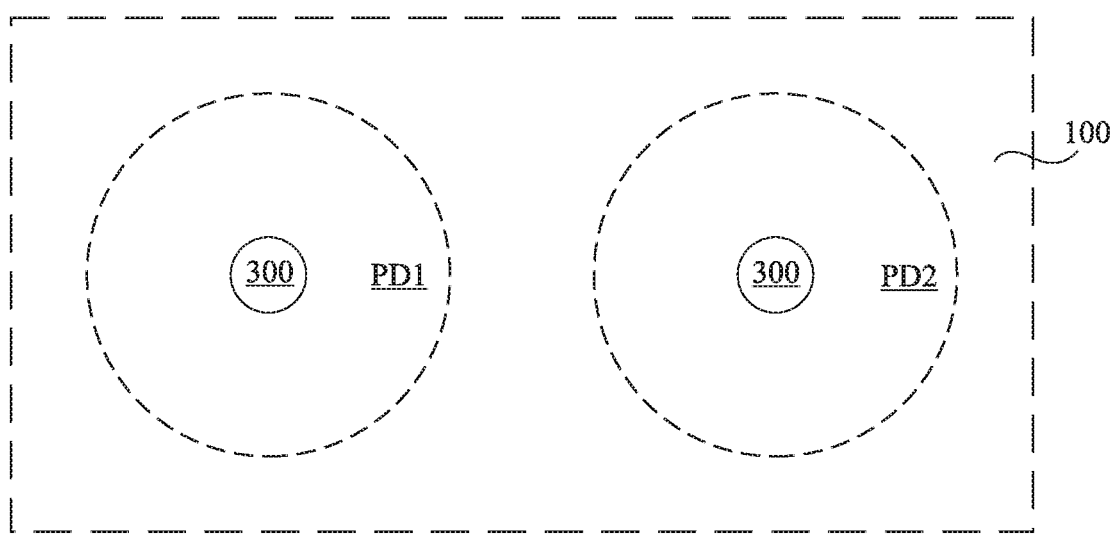
FIG. 6 shows a top view, schematic and in cross-section, of the sensor of FIG. 4 according to another embodiment variant.

FIGS. 5 and 6 each show a schematic and cross-sectional top view of the sensor 2 of FIG. 4, taken in the section plane CC of FIG. 4. More specifically, FIG. 5 corresponds to the case where the diffraction gratings of the pixels of the sensor 2 are of the type disclosed in relation with FIG. 1B, while FIG. 6 corresponds to the case where the diffraction gratings of the pixels of the sensor 2 are of the type disclosed in FIG. 3B.

In these two figures, the photoconversion zones PD1 and PD2 are delimited laterally by dotted lines in the form of diffraction gratings, for example a square or rectangular shape in the case of FIG. 5, or a circular shape in the case of FIG. 6.

The material 300, seen from above, is in the shape of a rectangular strip in the case of FIG. 5. For example, the material 300 is in the shape of a strip parallel to the longitudinal direction of the openings of the grating, penetrating a central part of the photoconversion zone, and extending from a first edge to a second edge opposite the photoconversion zone.

The material 300, seen from above, is in the shape of a disc in the case of FIG. 6. For example, the material is in the shape of a disc positioned at the center of the photoconversion zone.

Figure 7:
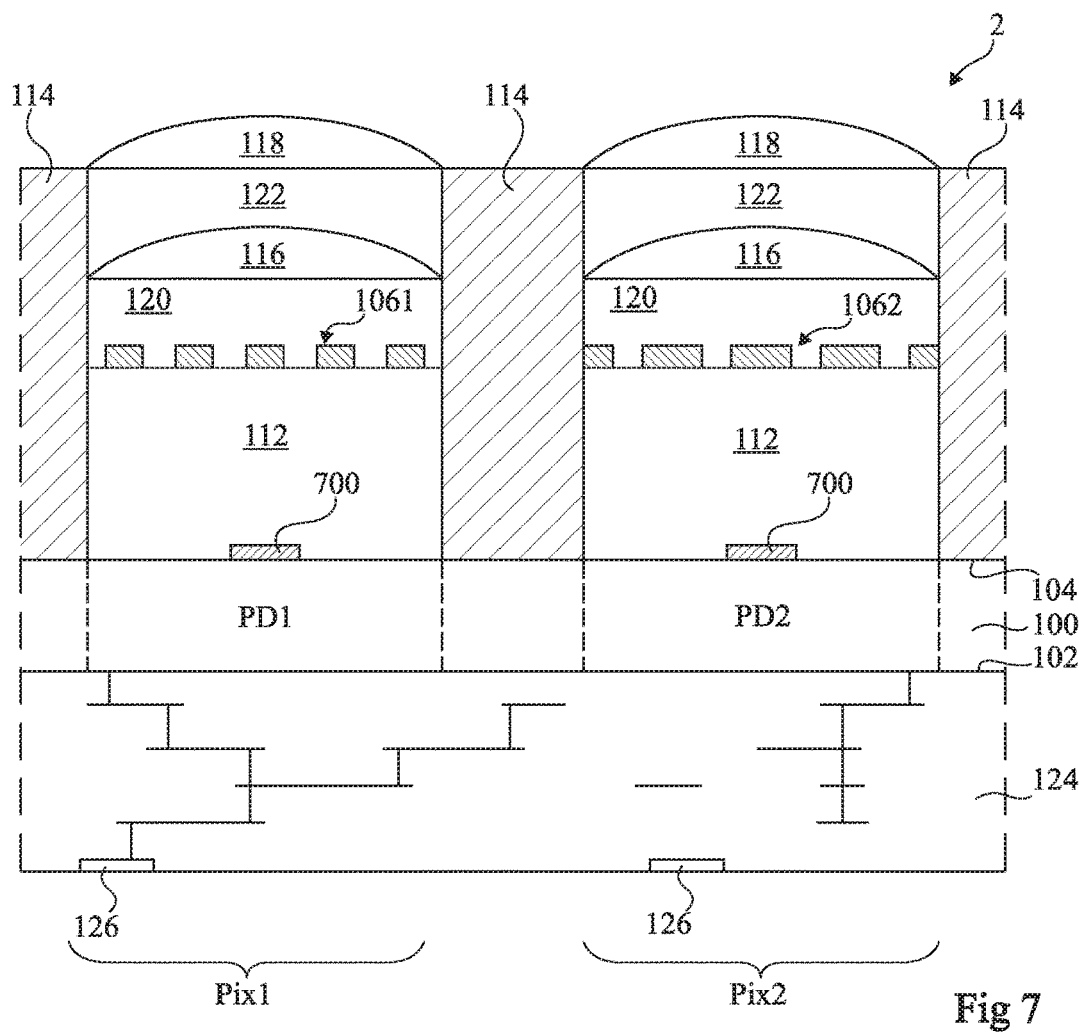
FIG. 7 shows a transverse view, schematic and in cross-section, of the light sensor of FIG. 4 according to another embodiment variant.

FIG. 7 shows a schematic and transverse cross-sectional view of the sensor 2 of FIG. 4 according to another embodiment variant. Each pixel of the sensor 2 of FIG. 7 differs from a corresponding pixel of the sensor 2 of FIG. 4 only by the manner in which its device that allows the zero order of the diffracted light to be prevented from reaching the photoconversion zone of the pixel is implemented.

In the embodiment variant of FIG. 7, in each pixel, this device comprises a material 700 absorbing at the operating wavelengths of the sensor 2, for example made from the same material as the wall 114. The material 700 is positioned on the path of the zero order of the light transmitted by the diffraction grating of the pixel. Preferably, the material 700 rests on the face 104 of the substrate 100.

Although this is not illustrated, the shape of the material 700 is, in top view, similar, or even identical, to that of the material 300 disclosed in relation with FIGS. 5 and 6, according to which the diffraction grating of the considered pixel is respectively of the type described in relation with FIGS. 1A-1B or of the type described in relation with FIGS. 3A-3B.

The various variants disclosed in relation with the sensor 1, and the various light analysis embodiments disclosed in relation with the sensor 1, apply to the sensor 2 disclosed in relation with FIGS. 4 to 7.

FIGS. 8 to 12 show schematic and transverse cross-sectional views of a structure in successive steps of a mode of implementation of the method for manufacturing the light sensor of FIG. 1.

Figure 8:
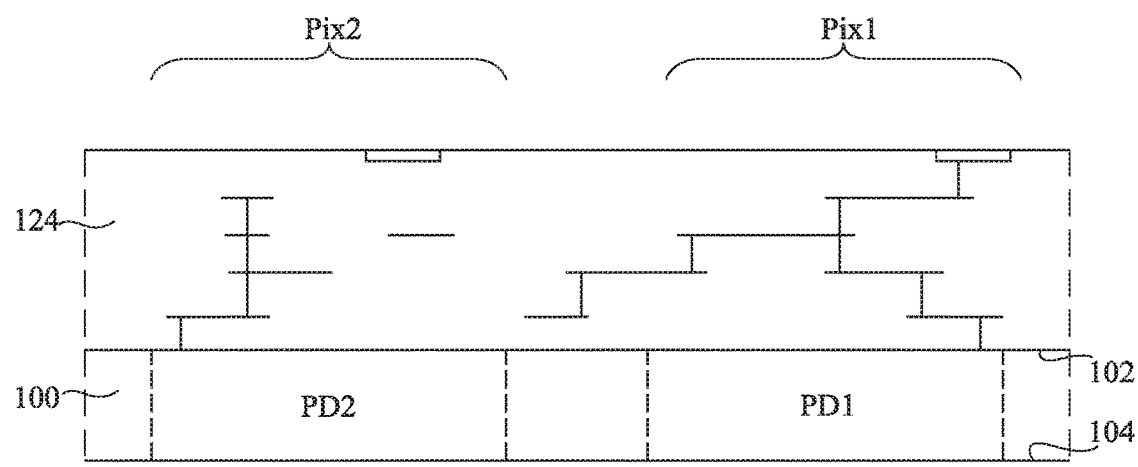
FIG. 8 shows a transverse view, schematic and in cross-section, illustrating a step of an embodiment of a method for manufacturing a light sensor.

In the step illustrated by FIG. 8, the photoconversion zones of the future pixels of the sensor 1 are formed from the front face 102 (the upper face in FIG. 8) of the substrate 100, only the zones PD1 and PD2 of the future pixels Pix1 and Pix2 being visible in FIG. 8. Although this is not shown here, electronic components and circuits (not shown) are formed on the side of the face 102, in and/or on the substrate 100.

The interconnection structure 124 is next formed on the front face 102 of the substrate 100.

Furthermore, a thinning step of the substrate 100 from its back face 104 (the lower face of the substrate 100 in FIG. 8) can be provided, for example such that the photoconversion zones extend through the entire thickness of the substrate 100.

Although this is not shown here, a step for forming the material 300 or 700 can be provided before the formation of the interconnection structure 124, in the case where a sensor 2 is manufactured. For example, in each pixel, the material 300 can be deposited so as to fill a trench previously etched through the photoconversion zone of the pixel.

Figure 9:
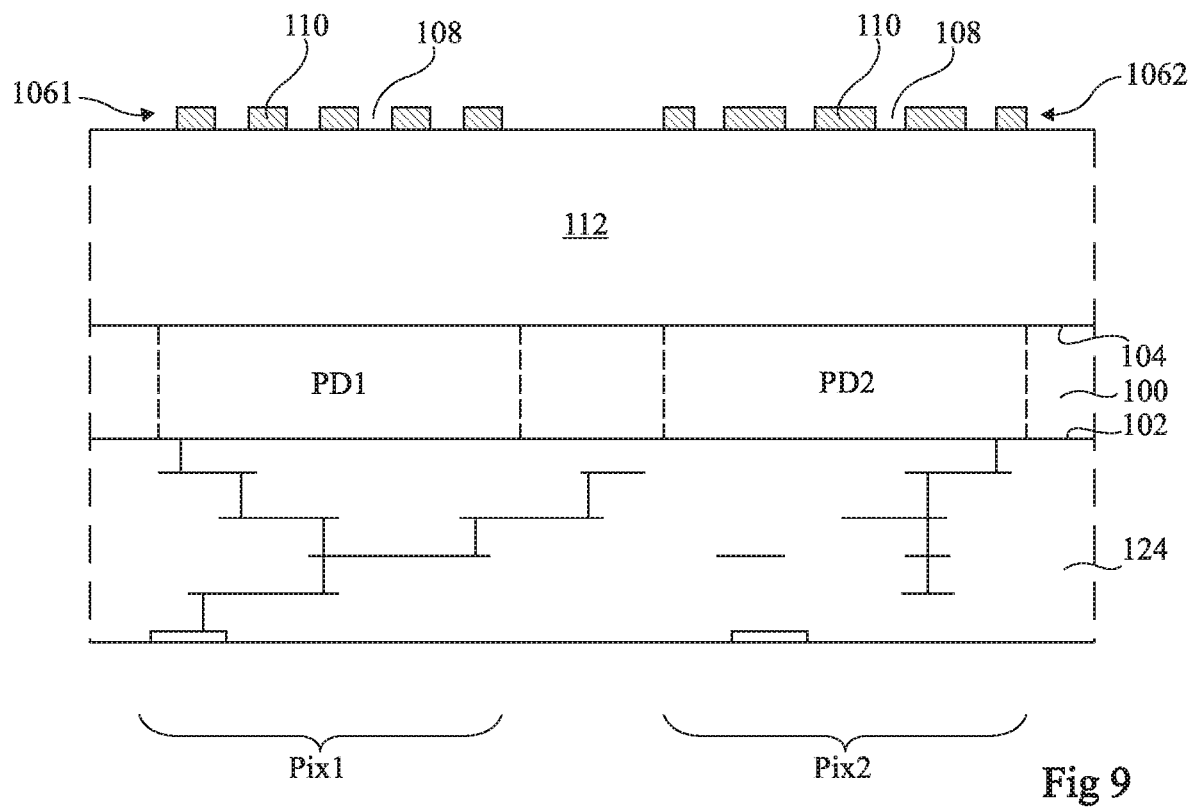
FIG. 9 shows a transverse view, schematic and in cross-section, illustrating another step of the method of FIG. 8.

In this step illustrated by FIG. 9, the structure illustrated in FIG. 8 has been turned over, and the layer 112 has been formed on the entire back face 104 (the upper face of the substrate 100 in FIG. 9). The layer 112 has for example been formed by "solid plate" deposition, that is to say, over the entire exposed surface of the structure.

The diffraction gratings are next formed on the upper face of the layer 112, only the diffraction gratings 1061 and 1062 of the respective pixels Pix1 and Pix2 being visible here. For example, a layer of material 110 is formed on the entire upper surface of the layer 112, for example by solid plate deposition, then etched to define the openings 108 of the diffraction grating therein. During this etching step, portions of the layer 110 positioned in the location of the future walls 114 can also be removed by etching, as shown in FIG. 9, or left in place. In this embodiment, the diffraction gratings are of the type disclosed in relation with FIGS. 1A-1B. In a variant, these diffraction gratings are of the type disclosed in relation with FIGS. 3A-3B.

Figure 10:
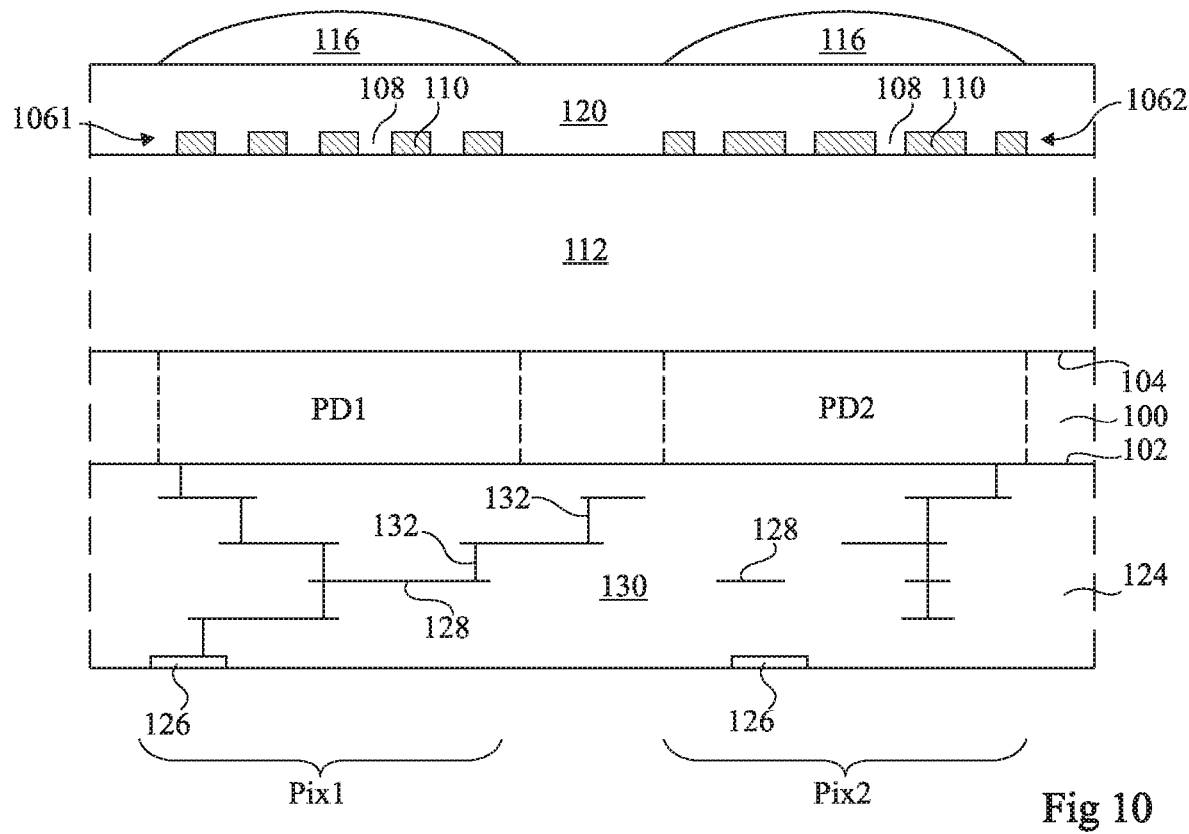
FIG. 10 shows a transverse view, schematic and in cross-section, illustrating still another step of the method of FIG. 8.

In the step illustrated by FIG. 10, the layer 120 is formed over the entire upper surface of the structure disclosed in relation with FIG. 9, the layer 120, for example, being formed by a solid plate deposition.

The lenses 116 are next formed on the upper face of the layer 120, each lens 116 being formed above a corresponding diffraction grating.

In the case, not illustrated, where the manufactured sensor is devoid of lenses 116, the step for forming the latter is omitted.

Similarly, in the case, not illustrated, where the manufactured sensor is devoid of the layer 120, the step for forming the latter is omitted.

Figure 11:
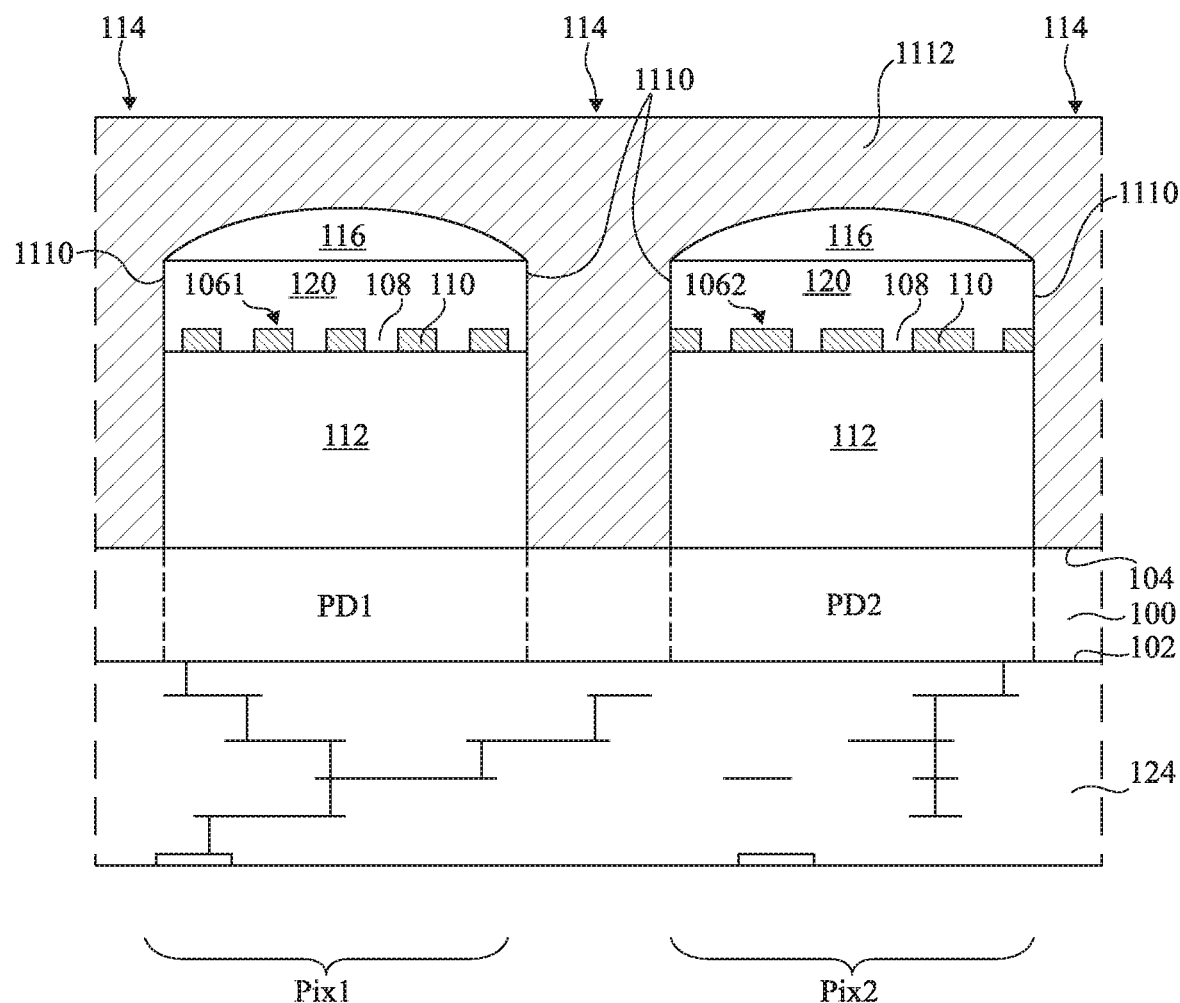
FIG. 11 shows a transverse view, schematic and in cross-section, illustrating still another step of the method of FIG. 8.

In the step of FIG. 11, trenches 1110 are etched in the location of the future walls 114, through the layer 120 (when the latter is present), any portions of the layer 110 left in place in these locations, and the layer 112, up to the back face 104 of the substrate 100. In other words, the trenches 1110 are etched in the location of the future walls 114 from the upper face of the structure, up to the face 104 of the substrate 100. The trenches 1110 are etched so as to completely surround each diffraction grating.

A component material 1112 of the walls 114, for example black resin or polycrystalline silicon, is next deposited over the entire upper face of the structure (solid plate deposition), so as to fill the trenches 1110 to form the walls 114 therein.

In the case where the walls 114 protrude above the diffraction gratings, as is the case in FIG. 11, the material 1112 is deposited with a sufficient thickness for the upper wall of the material 1112 to be level with the apex of walls 114, after a flattening step of its upper face, for example a step for chemical mechanical polishing (CMP), or after the deposition of the material 1112 directly with a planar upper face. In other words, the material 1112 is deposited such that its measured thickness, in the trenches 1110, between the face 104 of the substrate 100 and the planar upper face of the material 1112, is at least equal to the thickness, or height, of the walls 114.

In FIG. 11, the upper surface of the material 1112 is, for example, located above the lenses 116. In other words, the material 1112 covers the lenses 116.

Figure 12:
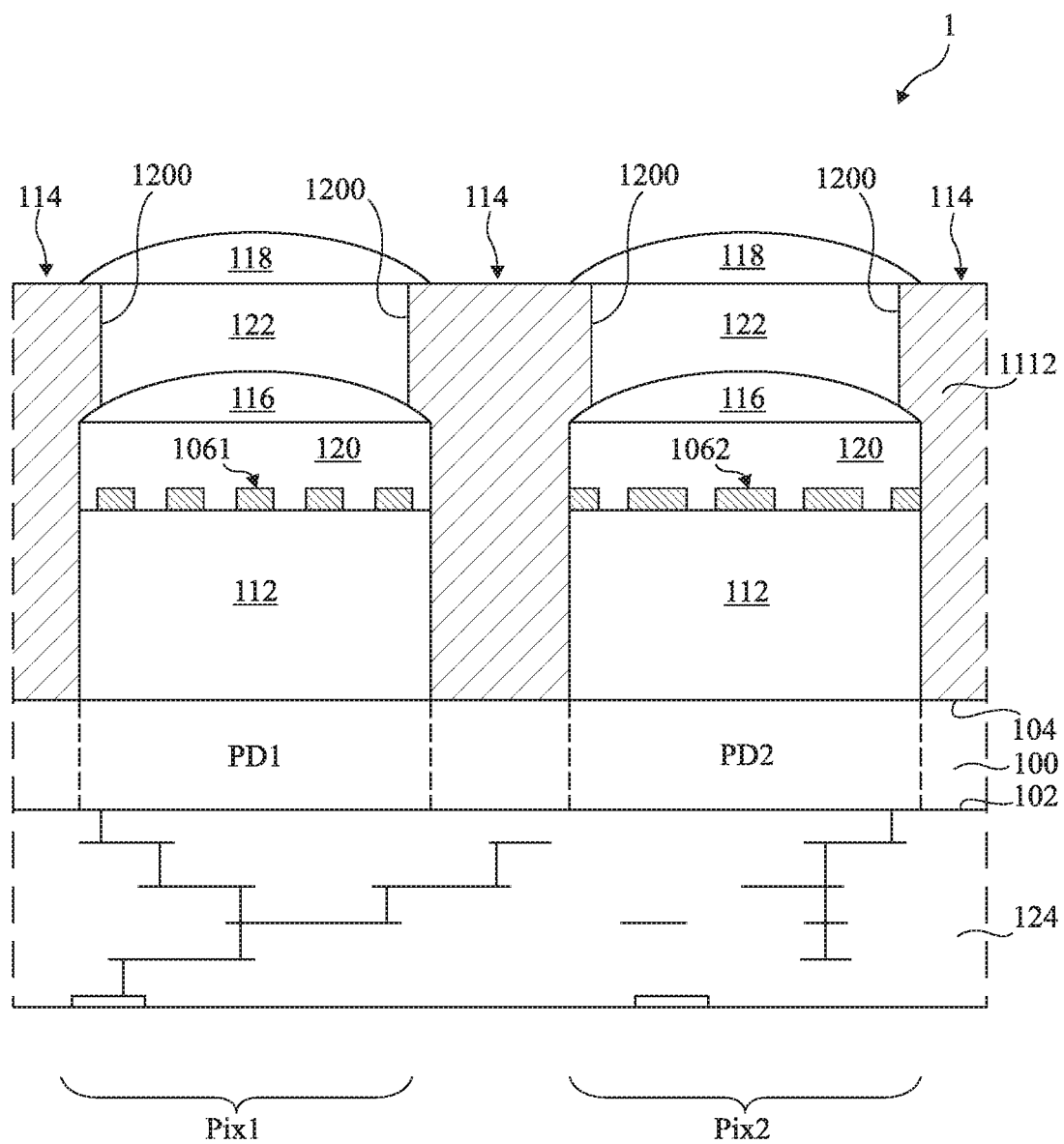
FIG. 12 shows a transverse view, schematic and in cross-section, illustrating still another step of the method of FIG. 8.

In the step of FIG. 12, an opening 1200 is etched above each diffraction grating, through the material 1112, so as to leave only the walls 114 in place in the material 1112.

The layer 122 is next deposited so as to fill the openings 1200. As an example, the layer 122 is deposited over the entire structure (solid plate deposition) and portions of the layer 122 located above the upper face of the material 1112 are next removed, for example during a flattening step, for example by CMP.

The lenses 118 are next formed on the planar upper face of the structure, above the lenses 116. Each lens 118 rests on a portion of the layer 122 filling a different opening 1200.

One then obtains the sensor 1 as disclosed in relation with FIGS. 1A-1B.

In the case, not illustrated, where the manufactured sensor is devoid of lenses 118, the step for forming the latter is omitted.

In the case, not illustrated, where the manufactured sensor is devoid of the layer 120, the step for depositing the latter is omitted.

In the case, not illustrated, where the manufactured sensor is devoid of the layer 122, the step for depositing the latter is omitted.

In the case, not illustrated, where the manufactured sensor comprises walls 114 extending heightwise exactly up to the diffraction gratings, the step for etching the openings 1200 is omitted.

More generally, one skilled in the art is able to adapt the steps of the method disclosed hereinabove to the various embodiments and variants of the sensors 1 and 2 previously disclosed. Furthermore, other embodiment variants will appear to one skilled in the art. For example, it is possible to provide that the lenses 116 are formed after the etching of the trenches 1110 (FIG. 11) and before the deposition of the material 1112. According to another example, it is possible to provide that the trenches 1110 are only etched after a solid plate deposition of the layer 122, and optionally after the formation of the lenses 118, the trenches then being etched through the layer 122, the layer 120 and the layer 112 and the material 1112 being deposited after the etching of the trenches 1110.

The light sensors 1 and 2 previously disclosed in relation with FIGS. 1A to 7 and 12 are, for example, used as ambient light sensors (ALS), for example to determine a type of ambient light (natural light, incandescent light, fluorescent light, etc.), for example to next adapt the light emitted by a display screen to the type of ambient light. Such ambient light sensors can for example be provided in smartphones, tablets, and more generally, electronic systems comprising a display screen.

The light sensors 1 and 2 previously disclosed in relation with FIGS. 1A to 7 and 12 are for example used to determine the composition of a sample to be analyzed, by using a light source, preferably a light source with a known spectrum, and by analyzing the spectrum of the light transmitted through the sample to be analyzed and/or the spectrum of the light reflected by the sample to be analyzed.

Various embodiments and variants and various modes of implementation have been disclosed. Those skilled in the art will understand that certain features of these embodiments can be combined and other variants will readily occur to those skilled in the art. For example, the light sensor previously disclosed may comprise other pixels configured to capture an image of a scene and not to analyze the spectrum of the light received by the sensor, as is the case for the pixels Pix1 and Pix2. Furthermore, it is possible to provide diffraction gratings different from those disclosed in relation with FIGS. 1A-1B and 3A-3B, for example diffraction gratings similar to those disclosed in relation with FIGS. 1A-1B but further comprising additional openings that are, seen from above, in the shape of rectangular strips parallel to one another and orthogonal to the rectangular strips or openings 108. One skilled in the art is able to adapt the disclosed embodiments, modes of implementation and variants to these diffraction gratings comprising additional openings orthogonal to the openings 108.

Finally, the practical implementation of the embodiments and variants described herein is within the capabilities of those skilled in the art based on the functional description provided hereinabove. In particular, the theory of diffraction gratings in transmission is well known by one skilled in the art, who is therefore able to determine the dimensions of the openings and the pitches of the openings of the gratings in order to obtain a light sensor as previously disclosed. Likewise, one skilled in the art is able, by measurement, to determine the dimensions of the pixels (position of the diffraction gratings relative to the face 104, dimensions of the diffraction gratings, dimensions of the photoconversion zones configured to receive light to be analyzed, positions of the lenses relative to one another and relative to the diffraction gratings, etc.) in order to implement a light sensor as disclosed hereinabove, in particular as a function of the number and/or width of the wavelength ranges for analysis of the light received by the sensor.

The invention claimed is:

1. A light sensor, comprising:
a semiconductor substrate; and
a plurality of pixels, wherein each pixel comprises:
  a photoconversion zone extending in the semiconductor substrate between a front face and a back face of the semiconductor substrate;
  an optical diffraction grating positioned over the back face of the semiconductor substrate and facing the photoconversion zone of the pixel; and
  a wall configured to be absorbent at operating wavelengths of the sensor, said wall positioned to laterally surround the optical diffraction grating of the pixel and extend heightwise from the back face of the semiconductor substrate at least up to a level of the optical diffraction grating of the pixel;
wherein the optical diffraction grating of one pixel of said plurality of pixels and the optical diffraction grating of another pixel of said plurality of pixels have different pitches.

2. The sensor according to claim 1, wherein the optical diffraction grating for each pixel of said plurality of pixels is located at a same distance from the back face of the semiconductor substrate.

3. The sensor according to claim 1, wherein each pixel comprises an optical device configured so that light reaches the optical diffraction grating of the pixel with a normal angle of incidence.

4. The sensor according to claim 3, wherein said optical device of each pixel comprises a first converging lens and a second converging lens, the first and second lenses being positioned one above the other, above and opposite the optical diffraction grating of said pixel.

5. The sensor according to claim 1, wherein part of the photoconversion zone configured to receive light at the back face of the semiconductor substrate has an identical surface for each pixel of said plurality of pixels.

6. A light sensor, comprising:
a semiconductor substrate; and
a plurality of pixels, wherein each pixel comprises:
  a photoconversion zone extending in the semiconductor substrate between a front face and a back face of the semiconductor substrate;
  an optical diffraction grating positioned over the back face of the semiconductor substrate and facing the photoconversion zone of the pixel; and
  a device configured to prevent a zero order propagation of the light transmitted by the optical diffraction grating of the pixel from reaching the photoconversion zone of the pixel;
wherein the optical diffraction grating of one pixel of said plurality of pixels and the optical diffraction grating of another pixel of said plurality of pixels have different pitches.

7. The sensor according to claim 6, wherein the device configured to prevent the zero order propagation comprises:
an electrically insulating material penetrating the semiconductor substrate from the back face of the semiconductor substrate and extending into the photoconversion zone of the pixel and being located on a zero order path of the light transmitted by the optical diffraction grating of the pixel.

8. The sensor according to claim 6, wherein the device configured to prevent the zero order propagation comprises:
a material absorbing at the operating wavelengths of the sensor and resting in contact with the back face of the semiconductor substrate and being positioned on a zero order path of the light transmitted by the optical diffraction grating of the pixel.

9. The sensor according to claim 1, wherein the optical diffraction grating of each pixel comprises:
a layer of a first material opaque at the operating wavelengths of the sensor; and
a plurality of openings passing through the layer of the first material, the openings being distributed along a pitch of said optical diffraction grating and preferably being concentric and circular.

10. The sensor according to claim 1, wherein the optical diffraction grating of each pixel comprises:
a layer of a first material having an optical index at the operating wavelengths of the sensor that is at least one and a half times greater than an optical index of a second material that is in contact with the first material; and a plurality of openings passing through the layer of the first material, the openings being distributed along a pitch of said optical diffraction grating and preferably being concentric and circular.

11. The sensor according to claim 1, wherein the optical diffraction grating of each pixel comprises:

a layer of a first material opaque at the operating wavelengths of the sensor; and a plurality of openings passing through the layer of the first material, the openings being distributed along a pitch of said optical diffraction grating and preferably being parallel to one another.

12. The sensor according to claim 1, wherein the optical diffraction grating of each pixel comprises:

a layer of a first material having an optical index at the operating wavelengths of the sensor that is at least one and a half times greater than an optical index of a second material and that is covering and is in contact with the first material; and a plurality of openings passing through the layer of the first material, the openings being distributed along a pitch of said optical diffraction grating and preferably being parallel to one another.

13. The sensor according to claim 1, wherein said semiconductor substrate further includes a processing circuit configured to receive, for each of said pixels, an output signal of the pixel representative of a quantity of light received by the pixel during an illumination phase of the sensor.

14. The sensor according to claim 13, wherein the processing circuit is configured to:

determine from the output signals of at least one pair of pixels of the sensor whose diffraction gratings have different pitches a portion of light to be analyzed received in a wavelength range determined by the pitches of the diffraction gratings of the pair of pixels.

15. The sensor according to claim 13, wherein the processing circuit is configured to:

determine a type of light received by the sensor during the illumination phase by comparing a set of values of said signals to sets of calibration values.

16. A method for manufacturing a sensor, comprising:

depositing a layer of a material transparent at operating wavelengths of the sensor on a back face of a semiconductor substrate provided with photoconversion zones extending in the semiconductor substrate between a front face and the back face of the semiconductor substrate;

depositing a layer of a first material on the layer of the transparent material;

etching openings through the layer of first material so as to define an optical diffraction grating therein positioned above each photoconversion zone;

depositing a layer of a second material that covers the first and is in contact with the first material;

wherein said first material is one of: opaque at said operating wavelengths or has an optical index at said operating wavelengths that is at least one and a half times greater than an optical index of the second material;

wherein the optical diffraction grating for two different photoconversion zones have different pitches;

etching trenches extending through both the layer of the second material and the layer of transparent material to reach said back face, wherein the trenches have a shape that laterally surrounds each optical diffraction grating; and filling said trenches with a material that is absorbent at said operating wavelengths.

17. A method for analysis of light sensed by a sensor, comprising:

receiving light to be analyzed by a plurality of pixels of the sensor, wherein each pixel has an optical diffraction grating over a photoconversion zone, and wherein the optical diffraction grating of one pixel of said plurality of pixels and the optical diffraction grating of another pixel of said plurality of pixels have different pitches;

generating by each pixel of the sensor an output value of the pixel representative of the quantity of light to be analyzed that is received by the pixel;

performing a calibration step wherein the sensor is illuminated successively with light of different types and the sensor stores, for each of the lights of different types, a map of the output values of the pixels; and determining a type of said received light to be analyzed by comparing the maps stored by the sensor during the calibration step to a map of the output values of the pixels generated when the sensor is illuminated with the light to be analyzed.

18. The method according to claim 17, further comprising, for at least one pair of pixels of the sensor whose diffraction gratings have different pitches, determining from output values of the pixels of said at least one pair a proportion of light to be analyzed received in a determined wavelength range by the pitches of the diffraction gratings of the pair of pixels.

* * * * *